United States Patent
Sze et al.

(10) Patent No.: US 7,851,721 B2
(45) Date of Patent: Dec. 14, 2010

(54) ELECTRONIC DEVICE SORTER COMPRISING DUAL BUFFERS

(75) Inventors: Chak Tong Albert Sze, Kwai Chung (HK); Pei Wei Tsai, Kwai Chung (HK); Ho Yin Wong, Kwai Chung (HK); Tin Yi Chan, Hong Kong (HK)

(73) Assignee: ASM Assembly Automation Ltd, Hong Kong (HK)

( * ) Notice: Subject to any disclaimer, the term of this patent is extended or adjusted under 35 U.S.C. 154(b) by 25 days.

(21) Appl. No.: 12/372,142

(22) Filed: Feb. 17, 2009

(65) Prior Publication Data

US 2010/0209219 A1 Aug. 19, 2010

(51) Int. Cl.
*B07C 5/344* (2006.01)

(52) U.S. Cl. .................. 209/573; 209/571; 414/937; 324/158.1

(58) Field of Classification Search ......... 209/571–574; 414/935–937, 940–941; 324/158.1
See application file for complete search history.

(56) References Cited

U.S. PATENT DOCUMENTS

| | | | | |
|---|---|---|---|---|
| 3,584,741 A | * | 6/1971 | Schirmer | 209/559 |
| 3,847,284 A | * | 11/1974 | Wiesler et al. | 209/3.3 |
| 5,484,062 A | * | 1/1996 | Rich | 209/587 |
| 5,568,870 A | * | 10/1996 | Utech | 209/573 |
| 5,807,066 A | * | 9/1998 | Smith | 414/802 |
| 5,842,579 A | * | 12/1998 | Garcia et al. | 209/573 |
| 5,855,104 A | * | 1/1999 | Schlagel et al. | 53/54 |
| 6,019,564 A | * | 2/2000 | Kiyokawa et al. | 414/223.01 |
| 6,547,902 B2 | * | 4/2003 | Arai et al. | 156/64 |
| 6,967,475 B2 | * | 11/2005 | Tsui et al. | 324/158.1 |
| 7,017,731 B2 | * | 3/2006 | Ikeda et al. | 198/464.3 |
| 7,390,158 B2 | * | 6/2008 | Takagi et al. | 414/222.01 |
| 7,612,575 B2 | | 11/2009 | Ito et al. | 324/465 |
| 2005/0062466 A1 | * | 3/2005 | Miyamoto | 324/158.1 |

* cited by examiner

Primary Examiner—Joseph C Rodriguez
(74) Attorney, Agent, or Firm—Ostrolenk Faber LLP

(57) ABSTRACT

A device handler for testing and sorting electronic devices has a testing station operative to test the electronic devices and to classify them according to different binning characteristics. A buffer assembly receives electronic devices which have been classified at the testing station, and the buffer assembly further comprises a first loading region having a plurality of receptacles and a second loading region having a plurality of receptacles. An output station is operative to unload electronic devices according to their different binning characteristics from either one of the first or second loading region of the buffer assembly for storage while electronic devices are being loaded onto the other loading region.

18 Claims, 4 Drawing Sheets

ELECTRONIC DEVICE SORTER COMPRISING DUAL BUFFERS

FIELD OF THE INVENTION

The present invention relates to a method and an apparatus for testing electronic components, such as light emitting diodes, and thereafter sorting the electronic components according to the characteristics of the electronic components.

BACKGROUND AND PRIOR ART

A Light Emitting Diode (LED) is a display and lighting technology which is widely used in electrical and electronic products on the market as LEDs use less power, have longer lifetimes and produce little heat as compared to traditional incandescent light bulbs, and emit colored light. After assembly of an LED, each LED is tested to determine its optical and electrical properties before being sorted according to its determined characteristics. Since the characteristics of the assembled LEDs vary widely, an elaborate sorting system is used to classify and separate them after assembly.

In conventional testing and sorting systems for LEDs, the LEDs are loaded onto the testing system from an onloader such as a bowl feeder or a wafer frame. Characterization of LEDs is carried out by conducting tests such as optical and electrical tests. After testing, the LEDs are sorted in an offloader which can be in form of a bin box or a wafer frame. When wafer frames are used as onloaders or offloaders, the testing and sorting of LEDs typically constitute separate testing and sorting systems. LEDs on an onloader wafer frame are conveyed to a testing system for testing. After testing, LEDs are loaded onto an output wafer frame according to a Cartesian or xy coordinate test map on the output wafer frame. FIG. 1 is an isometric view of a wafer frame 100 of a conventional LED testing system for receiving LEDs wherein the LEDs are mapped according to an exemplary Cartesian coordinate test map 102. The wafer frames loaded with tested LEDs are stacked in a magazine. Each loaded wafer frame is transferred from the magazine to a sorting system for the LEDs to be sorted according to a given Cartesian test map before being offloaded onto designated output wafer frames, each of which is identified with a desired binning characteristic. The number of output binning characteristics that are sortable is usually limited by the number of wafer frame magazines contained in the offloader.

In a conventional sorting system, only one LED can be offloaded at a time and only one offloading station is practical. As there is only one offloading station, once all the LEDs with desired characteristics are loaded onto a designated output wafer frame, the sorting process must be halted so that the output wafer frame can be removed and another designated output wafer frame such as one with a different binning characteristic is positioned before sorting continues. This introduces wafer exchange time wherein the sorting process is halted, and such idling time of the LED sorting system results in reduced throughput when sorting LEDs. It would therefore be desirable for sorting operations to be allowed to continue on an output wafer frame while a previous output wafer frame is being removed.

SUMMARY OF THE INVENTION

It is thus an object of the invention to seek to provide an apparatus and a method for sorting electronic components to achieve a higher overall throughput as compared to the conventional sorting system described above.

According to a first aspect of the invention, there is provided a device handler for testing and sorting electronic devices, comprising: a testing station operative to test the electronic devices and to classify them according to different binning characteristics; a buffer assembly for receiving electronic devices which have been classified at the testing station, the buffer assembly further comprising a first loading region having a plurality of receptacles and a second loading region having a plurality of receptacles; and an output station operative to unload electronic devices according to their different binning characteristics from either one of the first or second loading region of the buffer assembly for storage while electronic devices are being loaded onto the other loading region.

According to a second aspect of the invention, there is provided a method for testing and sorting electronic devices, comprising the steps of: testing the electronic devices at a testing station and classifying them according to different binning characteristics; loading the electronic devices which have been classified at the testing station onto receptacles comprised in a first loading region of a buffer assembly; and thereafter unloading electronic devices according to their binning characteristics from the first loading region of the buffer assembly to an output station for storage while simultaneously loading further electronic devices which have been classified at the testing station onto receptacles comprised in a second loading region of the buffer assembly.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of a preferred embodiment of the invention when considered with the accompanying drawings, in which.

DETAILED DESCRIPTION OF THE PREFERRED EMBODIMENT OF THE INVENTION

The preferred embodiment of the present invention will be described hereinafter with reference to the accompanying drawings.

Figure 1:
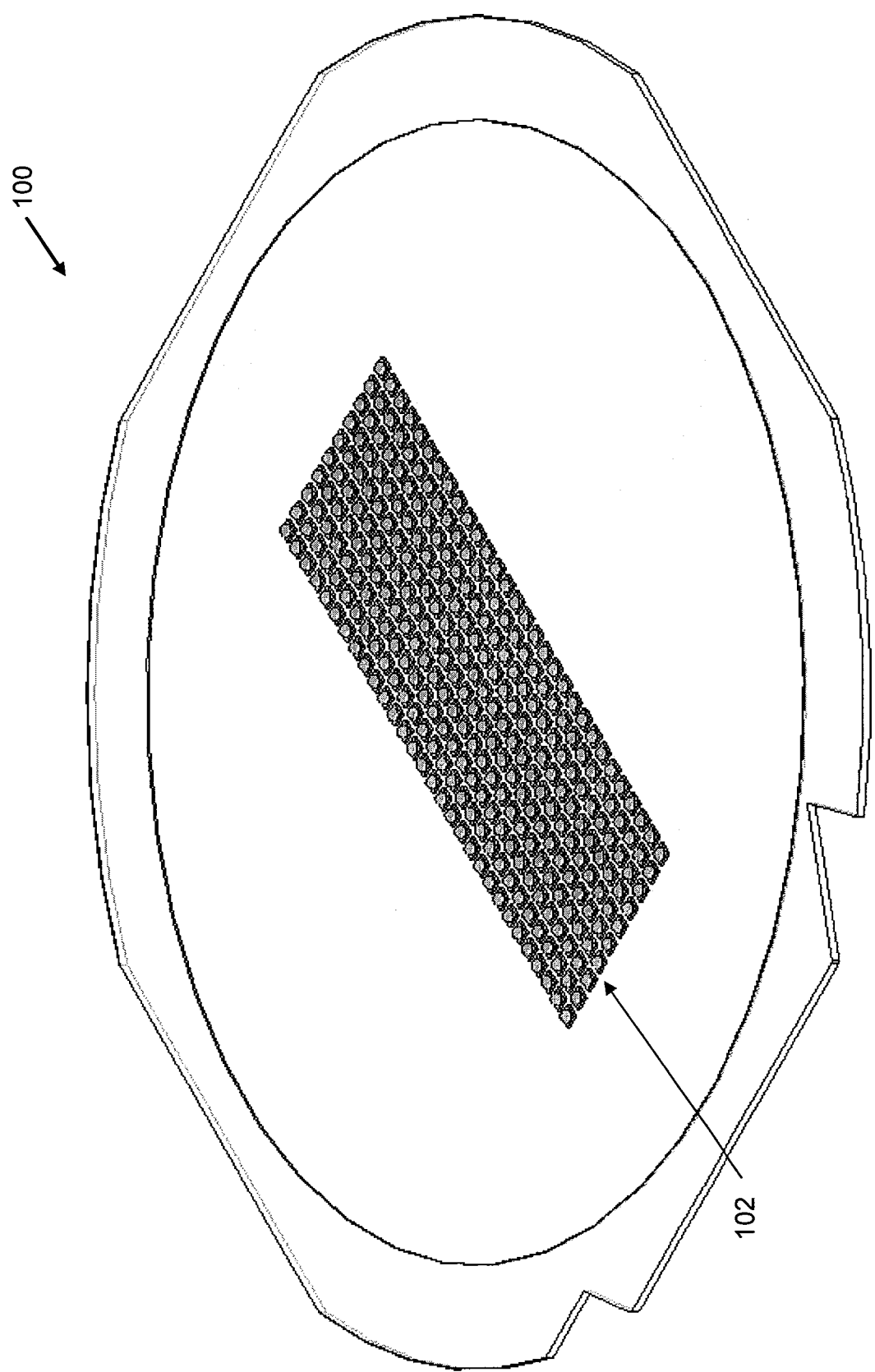
FIG. 1 is an isometric view of a wafer frame of a conventional LED testing system for receiving LEDs wherein the LEDs are mapped according to an exemplary Cartesian coordinate test map.
Figure 2:
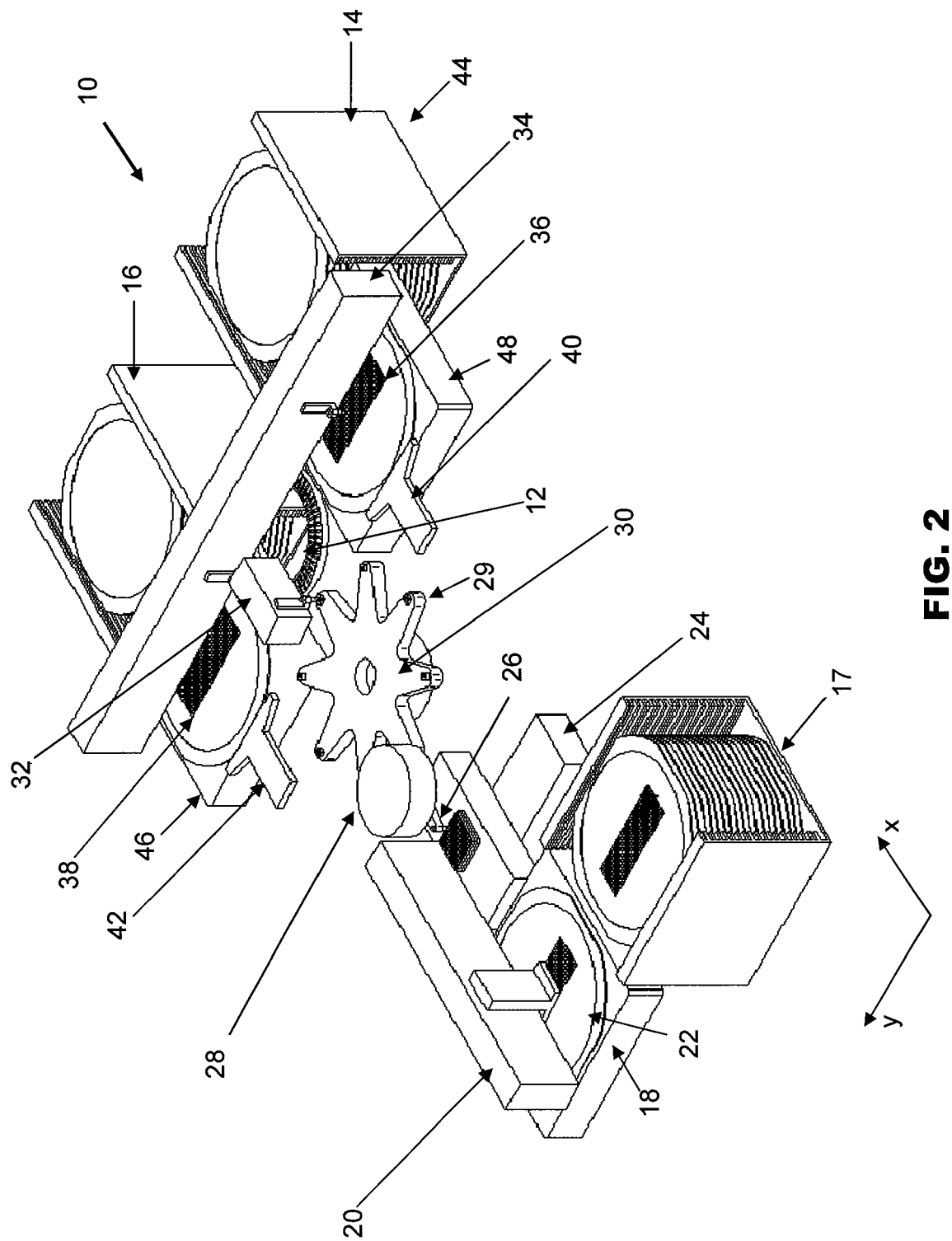
FIG. 2 is an isometric view of an LED handler including separate testing and sorting systems, the sorting system incorporating a dual turret buffer in accordance with the preferred embodiment of the invention.

FIG. 2 is an isometric view of an LED handler 10 including separate testing and sorting systems, the sorting system incorporating a dual turret buffer 12 in accordance with the preferred embodiment of the invention. The testing system of the LED handler 10 includes a wafer magazine loader 17 which may hold about 10 wafer frames, each carrying devices under test such as LEDs arranged according to a predetermined arrangement on a wafer test map. A single wafer frame 22 carrying a matrix of LEDs is transferred to a wafer table 18 where a first pick arm 20 is located over the wafer table 18. The LEDs located on the wafer frame 22 on the wafer table 18 are picked up by the first pick arm 20 and are transported to an x-y table 24. From the x-y table 24, each LED may be picked up by a rotary pick arm 26 of a rotary table 28 which picks up the LED and transfers it onto a turret table 30.

The turret table 30 has a plurality of rotary holding arms 29, wherein each holding arm supports a collet for holding an LED. The turret table 30 may further comprise a testing station (see FIG. 3) where the LEDs are tested and classified according to different binning characteristics. Various tests, such as optical and electrical tests, may be conducted on the LEDs at the testing station. Thereafter, a second pick arm 32 picks up the classified LEDs and loads them onto a buffer assembly, which may be in the form of a rotary dual turret buffer 12 for receiving the LEDs.

A third pick arm 34 picks up the tested LEDs from the dual turret buffer 12 and mounts them onto either first or second output wafer frames 36, 38 located at an output station, which preferably comprises two separate offloading positions 46, 48, for storage. Each output wafer frame 36, 38 is designated to receive LEDs with specific binning characteristics which have been sorted, and the said characteristics as well as corresponding output wafer frame are identified numerically by way of binning numbers. When any of the output wafer frames 36, 38 is completely loaded with designated binning LEDs, first and/or second magazine loaders 40, 42 will respectively move and load the output wafer frames 36, 38 to a wafer frame buffer 44. The wafer frame buffer 44 may include at least first and second wafer magazine loaders 14, 16, each configured for storing a column of output wafer frames with different binning characteristics. The first and second wafer magazine loaders 14, 16 are operatively connected to the first and second offloading positions 46, 48 respectively, and each wafer magazine loader 14, 16 is independently operable to provide output wafer frames to its connected offloading position 46, 48 and to receive output wafer frames mounted with LEDs for storage. Once an output wafer frame 36, 38 is mounted with LEDs of a desired binning characteristic and stored, output wafer frames 36, 38 with other required binning characteristics are exchanged and relocated into the two offloading positions 46, 48 to receive further tested LEDs.

Figure 3:
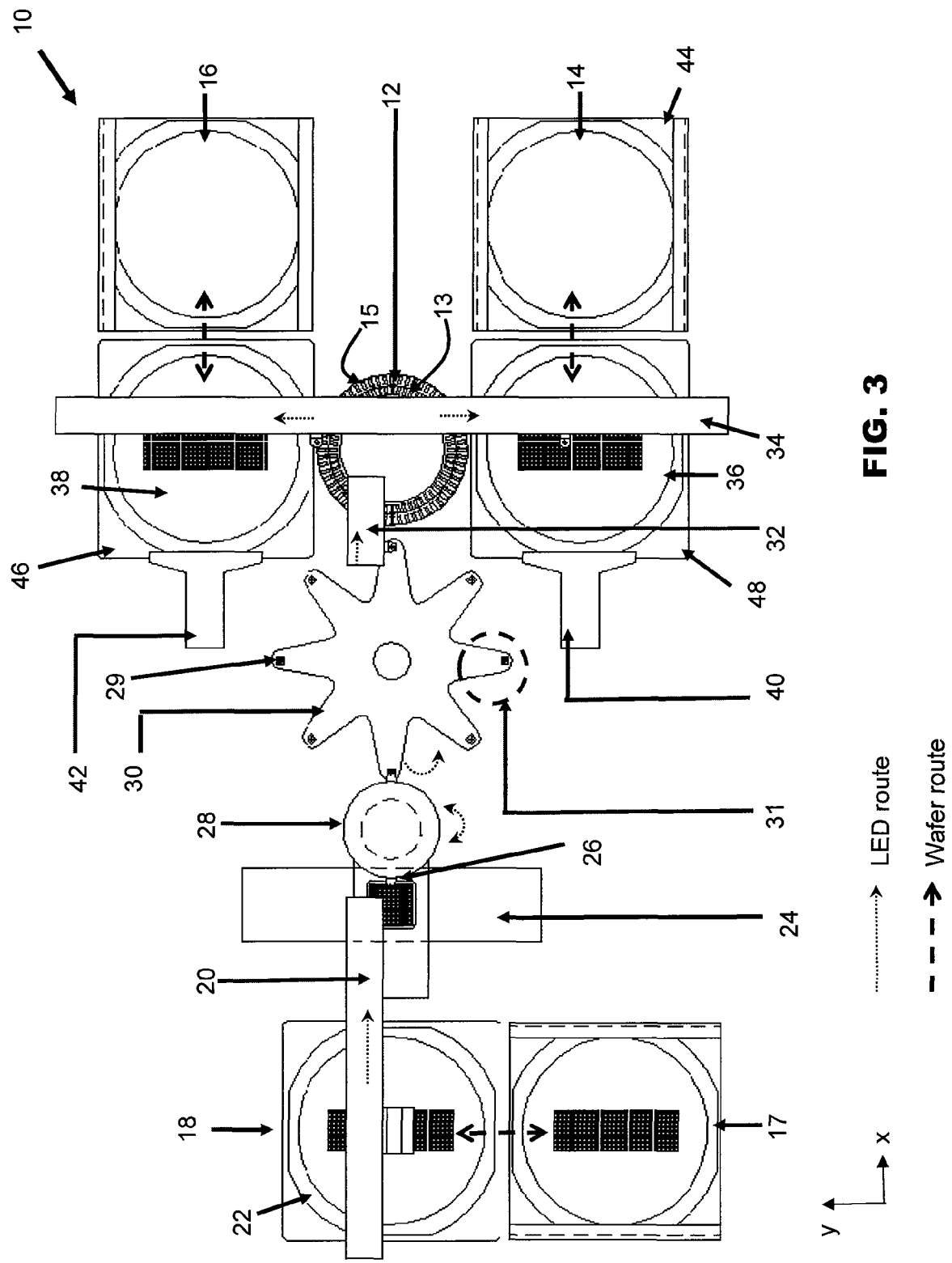
FIG. 3 is a plan view of the LED handler of FIG. 2.

FIG. 3 is a plan view of the LED handler 10 of FIG. 2. The arrows in the figure illustrate the paths traveled by LEDs and wafers in the LED handler 10. The wafer frame 22 is transported in the y axis and loaded from the wafer magazine loader 17 to the wafer table 18. LEDs which have been mounted onto the wafer frame 22 are removed from the wafer frame 22 and are transported by the first pick arm 20 along the x-axis. Alternatively, the wafer frame 22 is transported by the first pick arm 20 along the x-axis directly to the x-y table 24.

The LEDs undergo vision inspection for x, y and angular alignment before the wafer frame 22 is aligned with a pick-up position for the rotary pick arm 26 of the rotary table 28 to pick the LEDs. The rotary table 28 is rotatable by 180° in either clockwise or anti-clockwise directions to transfer and load the LEDs onto collets on the rotary holding arms 29 of the turret table 30. The LEDs on the x-y table 24 are moved along x and y directions until all the LEDs on the wafer are picked up by the rotary pick arm 26 and unloaded to the collets on the turret table 30. The turret table 30 is rotatable clockwise or anti-clockwise for transporting the LEDs to the designated testing station. Tests such as optical and electrical tests are carried out to ascertain the characteristics of each LED. In some cases, the optical test may require a testing station in the form of an integrating sphere 31 to perform luminosity tests. An integrating sphere 31 may be annexed to the turret table 30 for such optical test.

After testing, the LEDs will be unloaded by the second pick arm 32 onto the dual turret buffer 12. The dual turret buffer comprises two separately-identifiable first and second loading regions. Each loading region may comprise a ring-shaped arrangement of receptacles, so as to form an inner ring 13 and an outer ring 15. The inner ring 13 has a smaller diameter than and is encircled by the outer ring 15. The inner ring 13 or outer ring 15 of the dual turret buffer 12 receives the LEDs depending on whether the inner ring 13 or outer ring 15 is assigned as the loading or an unloading ring during each loading cycle. The inner ring 13 and outer ring 15 are preferably movable independently by motors and each can thus function separately as a loading ring or as an unloading ring respectively.

During sorting, the rotary holding arm 29 of the rotary table 30 may first load the tested LEDs onto the outer ring 15 of the dual turret buffer 12 until it is full. Next, the inner ring 13 may be assigned as a loading ring in place of the outer ring 15 so that the rotary holding arm 29 will load tested LEDs onto the inner ring 13. At the same time, the outer ring 15 may be assigned as an unloading ring. Hence, loading to and unloading from the two rings of the dual turret buffer 12 can occur simultaneously. The wafer frame buffer 44 provides two output wafer frames 36, 38 of the desired binning characteristics to the two offloading positions 46, 48 which are operative to individually receive the LEDs from the dual turret buffet 12. Tested LEDs on either the inner or outer rings 13, 15 of the turret buffet 12 can be unloaded by the pick arm 34 to one of these output wafer frames 36, 38 according to their binning characteristics, while other LEDs may be loaded simultaneously to the other ring on the dual turret buffer 12, which increases sorting efficiency.

An LED matrix is advantageously arranged in a polar coordinate system instead of the Cartesian system on the dual turret buffer 12. Conventional rectangular buffers arranged according to the Cartesian system may not engage the offloading positions of LEDs at all times as the buffers move in two axes only. Furthermore, these buffers do not provide continuous pathways as the rectangular buffers end at both ends. As such, the buffers have to move between their opposite ends frequently, which slows down the offloading process.

The dual turret buffer 12 arranged according to the polar coordinate system allows multiple offloading positions to be made available to improve offloading throughput, such as the two offloading positions 46, 48 adopted in this embodiment. The polar coordinate system also provides a continuous angular pathway which facilitates the movable dual turret buffer 12 to engage both offloading positions 46, 48 at all times. Additionally, overall buffer travelling distance from one position to another position of the turret buffer 12 may be shorter because the turret buffer 12 is rotatable both clockwise or anti-clockwise which reduces the operation time of the buffer for offloading the LEDs.

Furthermore as the output wafer frames 36, 38 can be moved independently, LEDs may be offloaded onto one output wafer frame at one offloading position while an exchange of output wafer frame can be carried out at the second offloading position. Idling time of the LED handler 10 can therefore be minimised, which results in improvement of the throughput of the LED handler 10.

Figure 4:
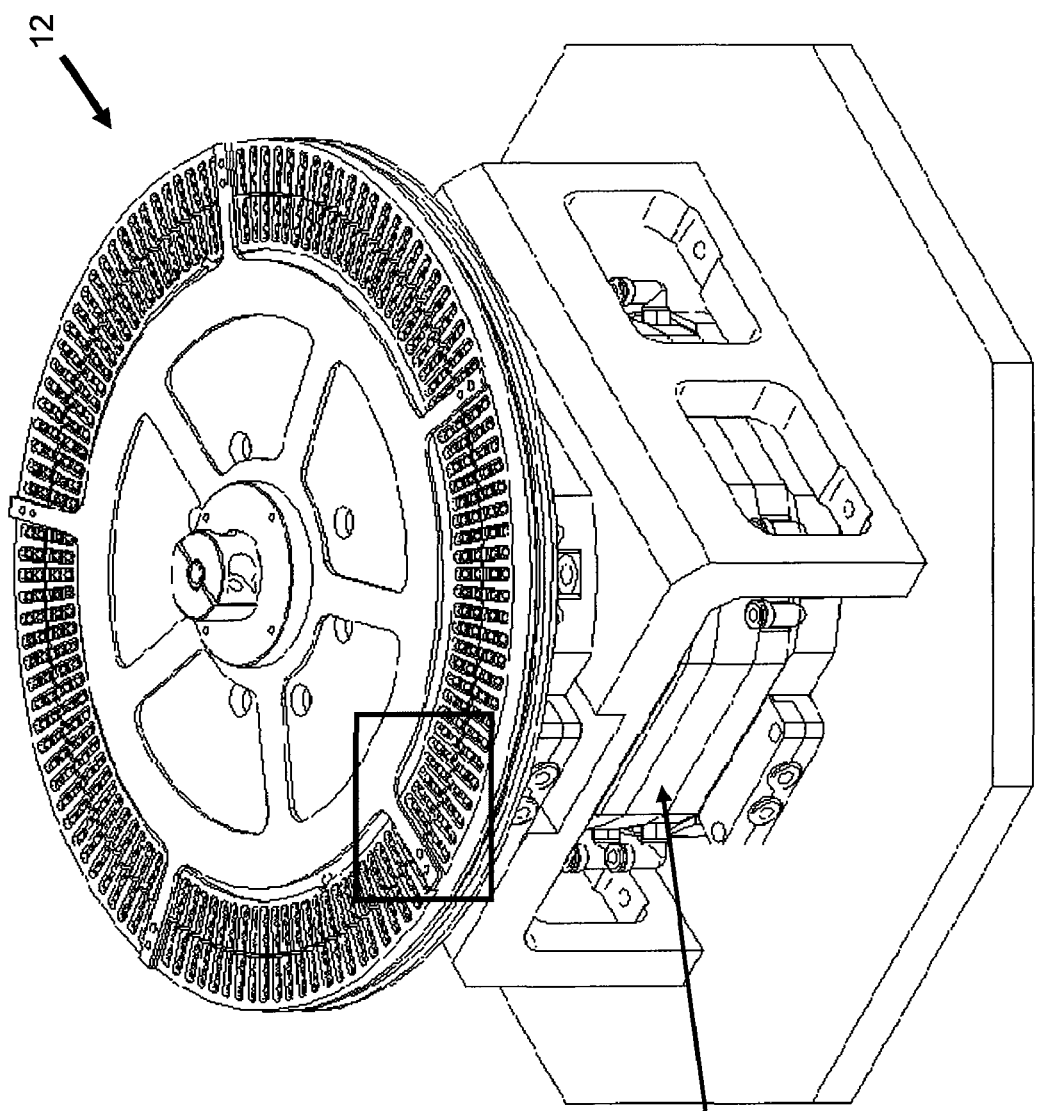
FIG. 4 is an isometric view of the dual turret buffer in accordance with the preferred embodiment of the invention.
Figure 5:
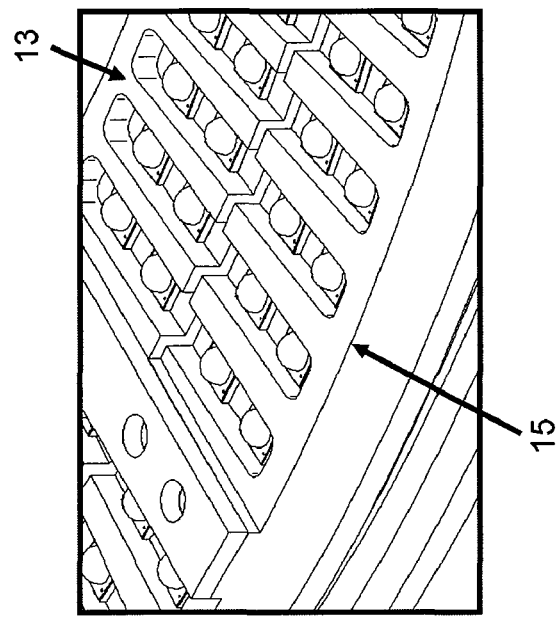
FIG. 5 is an enlarged view of a section of the dual turret buffer of FIG. 4.

FIG. 4 is an isometric view of the dual turret buffer 12 in accordance with the preferred embodiment of the invention. FIG. 5 is an enlarged view of a section of the dual turret buffer 12 which shows the inner ring 13 and the outer ring 15 respectively. The loading and unloading of LEDs to and from the receptacles of the dual turret buffer 12 is performed whilst identifying the positions of the LEDs on the receptacles according to the polar coordinate system with reference to a rotary center of the turret buffer 12. The inner and outer rings 13, 15 are driven by motors 50 and independently movable relative to each other during loading or unloading the LEDs from the rings. Therefore, either ring 13, 15 can be assigned as a loading ring to receive tested LEDs, or an unloading ring to offload tested LEDs onto the first and second output wafer frames 36, 38 located at the two offloading positions 46, 48.

It should be appreciated that the preferred embodiment of the invention as described above provides an apparatus and method for sorting electronic components more efficiently and improves sorting throughput. The dual turret buffer 12 provides a dual rotary mapping buffer which permits multiple offloading stations 46, 48. Hence, this allows the provision of two output wafer frames 36, 38 with different binning characteristics simultaneously whereas in the prior art with Cartesian coordinate test maps, only one output wafer frame can be loaded at a time. Additionally, when a first output wafer frame 36, 38 is completely loaded with designated binning LEDs, the output wafer frame can be exchanged with another output wafer frame from the wafer magazine loader 14, 16 while loading of a second output wafer frame continues. Having at least two wafer magazine loaders each storing multiple output wafer frames further allows exchange of wafer frames with minimal loss of working time. Thus, electronic components can be sorted at higher speeds since output wafer frame loading and unloading can be carried out at the same time.

The invention described herein is susceptible to variations, modifications and/or additions other than those specifically described and it is to be understood that the invention includes all such variations, modifications and/or additions which fall within the spirit and scope of the above description.

The invention claimed is:

1. A device handler for testing and sorting electronic devices, comprising:
    a testing station operative to test the electronic devices and to classify them according to different binning characteristics;
    a buffer assembly for receiving electronic devices which have been classified at the testing station, the buffer assembly further comprising a first loading region, having a plurality of receptacles, and a second loading region, having a plurality of receptacles, wherein the receptacles of the first loading region and the receptacles of the second loading region are independently movable relative to each other; and
    an output station operative to receive electronic devices according to their different binning characteristics from the plurality of receptacles in either one of the first or second loading regions of the buffer assembly for storage while electronic devices are being loaded onto the plurality of receptacles in the other loading region.

2. The device handler as claimed in claim 1, wherein the buffer assembly comprises a rotary turret on which the first and second loading regions are arranged.

3. The device handler as claimed in claim 2, wherein the first and second loading regions each comprises a ring-shaped arrangement of receptacles.

4. The device handler as claimed in claim 3, wherein one ring-shaped arrangement of receptacles has a smaller diameter than and is encircled by the other ring-shaped arrangement of receptacles.

5. The device handler as claimed in claim 3, wherein positions of electronic devices placed in the receptacles are identified by a polar coordinate system with reference to a rotary center of the turret.

6. The device handler as claimed in claim 1, wherein the output station comprises first and second offloading positions which are both operative to individually receive electronic devices from the buffer assembly for storage.

7. The device handler as claimed in claim 6, wherein the first and second offloading positions are each configured to hold one output wafer frame for receiving electronic devices unloaded from the buffer assembly for storage.

8. The device handler as claimed in claim 7, further comprising first and second wafer magazine loaders operatively connected to the first and second offloading positions respectively, each wafer magazine loader being independently operable to provide an output wafer frame to a respective offloading position and to receive an output wafer frame mounted with electronic devices for storage.

9. The device handler as claimed in claim 7, further comprising a first pick arm to load the electronic devices onto the receptacles in the first and second loading regions of the buffer assembly, and a second pick arm to unload the electronic devices from the receptacles in the first and second loading regions of the buffer assembly and to load the unloaded electronic devices onto the output wafer frames located at the output station.

10. A method for testing and sorting electronic devices, comprising the steps of:
    testing the electronic devices at a testing station and classifying them according to different binning characteristics;
    loading the electronic devices which have been classified at the testing station onto receptacles comprised in a first loading region of a buffer assembly; and thereafter
    unloading electronic devices according to their binning characteristics from the receptacles in the first loading region of the buffer assembly and loading the unloaded electronic devices onto an output station for storage while simultaneously loading further electronic devices which have been classified at the testing station onto receptacles comprised in a second loading region of the buffer assembly,
    wherein the step of unloading the electronic devices from the receptacles in the first loading region while loading the further electronic devices onto the receptacles in the second loading region further comprises the step of moving the receptacles of the first loading region and the receptacles of the second loading region relative to each other during said loading and unloading.

11. The method as claimed in claim 10, further comprising the subsequent steps of thereafter unloading electronic devices according to their binning characteristics from the receptacles in the second loading region of the buffer assembly and loading the unloaded electronic devices onto the output station for storage while simultaneously loading further electronic devices which have been classified at the testing station onto the receptacles in the first loading region of the buffer assembly.

12. The method as claimed in claim 10, wherein the buffer assembly comprises a rotary turret on which the first and second loading regions are arranged.

13. The method as claimed in claim 12, wherein the first and second loading regions each comprises a ring-shaped arrangement of receptacles.

14. The method as claimed in claim 13, wherein one ring-shaped arrangement of receptacles has a smaller diameter than and is encircled by the other ring-shaped arrangement of receptacles.

15. The method as claimed in claim 13, wherein the steps of loading and unloading electronic devices to and from the receptacles further comprise the step of identifying positions of the electronic devices in the receptacles according to a polar coordinate system with reference to a rotary center of the turret.

16. The method as claimed in claim 10, wherein the output station comprises first and second offloading positions which are both operative to individually receive electronic devices from the buffer assembly for storage.

17. The method as claimed in claim 16, wherein the step of unloading the electronic devices further comprises the step of providing one output wafer frame each to the respective first and second offloading positions and then loading the unloaded electronic devices onto the output wafer frames for storage.

18. The method as claimed in claim 17, further comprising the step of unloading the electronic devices from the buffer assembly and loading the unloaded electronic devices onto the output wafer frame located at either one of the first and second offloading positions while simultaneously exchanging the output wafer frame located at the other offloading position with another output wafer frame.

* * * * *